United States Patent [19]

Cormia et al.

[11] 4,046,659
[45] Sept. 6, 1977

[54] METHOD FOR COATING A SUBSTRATE

[75] Inventors: Robert L. Cormia, Oakland; Terry A. Trumbly, Orinda; Sigurd Andresen, Redwood City, all of Calif.

[73] Assignee: Airco, Inc., Montvale, N.J.

[21] Appl. No.: 540,044

[22] Filed: Jan. 10, 1975

Related U.S. Application Data

[63] Continuation-in-part of Ser. No. 469,004, May 10, 1974, abandoned.

[51] Int. Cl.² .............................................. C23C 15/00
[52] U.S. Cl. ........................... 204/192 C; 204/192 R; 204/192 D; 204/298
[58] Field of Search ............... 204/192, 298, 192 R, 204/192 C, 192 D

[56] References Cited

U.S. PATENT DOCUMENTS

| | | | |
|---|---|---|---|
| 3,336,211 | 8/1967 | Mayer | 204/192 |
| 3,655,438 | 4/1972 | Sterling et al. | 204/192 |
| 3,878,085 | 4/1975 | Corbani | 204/192 |
| 3,956,093 | 5/1976 | McLeod | 204/298 |

OTHER PUBLICATIONS

P. D. Davidse, "Theory and Practice of RF Sputtering," Vacuum, vol. 17/No. 3, Aug. 26, 1966, pp. 139-145.
Chapin, "The Planar Magnetron," Vacuum Technology, Jan. 1974, pp. 37-40.
Vratny, "Deposition of Tantalum and Tantalum Oxide by Superimposed RF and DC Sputtering," J. Electrochem. Soc., Solid State Science, pp. 505-507, May 1967.
Koenig et al, "Application of RF Discharges to Sputtering" by Koenig et al, IBM J. Res. & Dev., vol. 14, No. 2 (Mar. 1970), pp. 168-170.

*Primary Examiner*—O. R. Vertiz
*Assistant Examiner*—Wayne A. Langel
*Attorney, Agent, or Firm*—David A. Draegert; Edmund W. Bopp

[57] ABSTRACT

An improved method is described for coating a substrate in a system in which an insulating layer is also formed on one portion of a conductive target plate which is bombarded with ions. One such system is a reactive sputtering system in which a predetermined partial pressure of a reactive gas is established between a reactive metal target plate and the substrate. The bombarding ions are formed in a glow discharge plasma which may be magnetically confined. In accordance with the invention, an ac potential is applied to the target plate in order to prevent arcing which is believed due to the dielectric breakdown of the insulating layer.

8 Claims, 1 Drawing Figure

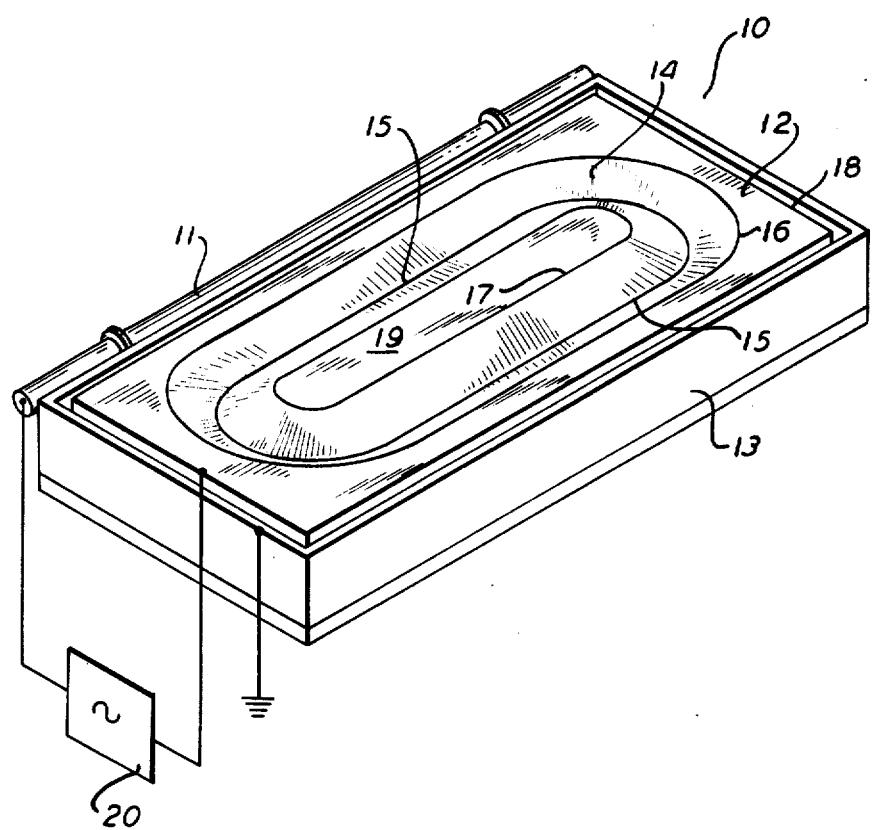

METHOD FOR COATING A SUBSTRATE

This application is a continuation-in-part of application Ser. No. 469,004 which was filed May 10, 1974, now abandoned.

BACKGROUND OF THE INVENTION

1. Field of the Invention

This invention relates generally to methods for coating a substrate by cathode sputtering. More particularly, it relates to methods for coating a substrate by use of a magnetron sputtering device.

2. Prior Art

Sputtering techniques for depositing a coating on a substrate are well known. Sputtering is the physical ejection of material from a target by ion bombardment of the target. The ions are usually created by collisions between gas atoms and electrons in a glow discharge. The ions are accelerated into the target cathode by an electric field. A substrate is placed in a suitable location so that it intercepts a portion of the ejected atoms. Thus, a coating is deposited on the surface of the substrate.

Certain devices, known generally as magnetron cathodes, are useful in obtaining higher sputtering rates and higher quality coating deposits. In a magnetron cathode, a magnetic field is used to confine the glow discharge plasma and to increase the length of the path of electrons moving under the influence of the electric field. This results in an increase in the gas atom-electron collision probability. This leads to a much higher sputtering rate than obtained without the use of magnetic confinement. Further, the sputtering process can be accomplished at a much lower gas pressure.

One particular type of magnetron cathode allows the use of a flat plate target. Such a planar magnetron cathode is sold under the trademark "SPUTTER-RING" by Airco Temescal, Berkeley, California, a division of Airco, Inc. The construction of a related device is described more particularly in copending John S. Chapin application 438,482 filed Jan. 31, 1974. In this device, the glow discharge plasma is confined to an annular region which is parallel to the surface of the target and separated from it by about a millimeter. In operation, the magnetic confinement of the plasma results in a high rate of erosion in an annular region on the surface of the target. This erosion region is aligned with the glow discharge region. Looking at one segment of this annular erosion region, the ion bombardment and the sputtering rate is greatest in the center of the segment directly under the most intense region of the gas discharge. The ion bombardment decreases toward the outer and the inner edges of the erosion region.

With this planar magnetron device, a substrate can be rapidly covered with a metallic coating by using a dc potential to sputter a target plate of the desired metal in a chamber containing an inert gas. However, a severe problem is encountered when it is attempted to form a metal-oxide coating on a substrate by reactively sputtering a metal target in a chamber containing oxygen. This problem is continual formation of high current arcs in the system. These arcs immediately reduce the sputtering rate. Further, the greatly increased current may damage components in the power supply. It is, of course, possible to prevent component damage by a design which limits the current. However, it is necessary to reduce the current in order to extinguish the arc. Even if the power supply were designed to reduce the current and automatically restore it, the effective sputtering rate would inevitably be decreased. Further, when the current is restored, the arc would be likely to reignite and require a subsequent power supply shutdown. It is clearly desirable to prevent the formation of an arc in the first place.

As is known in the art of reactive sputtering, the reactant gas is established at a partial pressure dependant upon the desired results. Since reactive sputtering is a well-known technique, and since the particular partial pressures are not critical to the invention, this aspect of the method of the invention will not be described in detail. It is sufficient that the partial pressure of the reactant gas be such as to cause the desired reaction with the atoms of the metal being sputtered but not so high that the sputtering process is inhibited by gas scattering. In reactive sputtering, the reactant gas forms a compound with the material which is sputtered from the target plate. When the target plate is a metal, and the reactant gas is oxygen, a metal oxide is formed on the surface of the substrate. The metal oxide may be formed by a reaction at the surface of the target plate, in the region between the target plate and the substrate, or at the surface of the substrate. The fraction of the substrate coating which is formed in the various locations is not known.

Reactive sputtering is just one example of a coating process in which an insulating layer may be formed on a conductive target which is being bombarded with ions.

SUMMARY OF THE INVENTION

Very generally, the method of this invention involves applying an alternating potential between a target and a second electrode in a substrate coating system, such as a reactive sputtering system, in which a layer of an insulating material is formed on a portion of the conductive target which is also bombarded with ions.

An ac potential of radio frequency greater than about 1 MHz is used with prior art sputtering systems when it is desired to sputter a target made from an insulating material. In these cases, the target is formed by completely covering a conductive surface with a relatively thick layer of the insulating material to be sputtered. If a dc potential is applied, the sputtering occurs for a time but the process cannot be maintained because the ion bombardment builds up a charge on the surface of the insulating layer. The deleterious effect of this surface charge is to reduce the sputtering rate by reducing the effective accelerating potential.

In the present situation with a magnetron cathode, the surface of the conductive target is not completely covered with an insulating layer. The sputtering rate at the center of the erosion region is very high so that portions of the conductive cathode are always exposed. Thus, in contrast to the preceeding situation, the full inter-electrode potential is always available for accelerating the ions.

It is also known to use a combination of radio frequency and dc electric potentials to accomplish reactive sputtering where the target is a metal or other conductor. In such a system, the radio frequency potential is used to increase the electron path length and thus the sputtering rate. In the present system the electron path length and the sputtering rate are increased by the use of a magnetron. Thus, there is no need to apply a radio frequency potential for that purpose.

It is an object of the present invention to provide an improved method for coating a substrate in a system in which an insulating layer is also formed on a portion of the surface of a target which is bombarded with ions or electrons. The improvement is to substantially eliminate arcing near the surface of the target.

Another object of the invention is to provide an improved method of coating a substrate by reactive sputtering using a planar magnetron device. The improvement is to increase the coating rate by eliminating the need to periodically reduce the current.

BRIEF DESCRIPTION OF THE DRAWING

The drawing illustrates the target plate of a planar magnetron sputtering device.

DESCRIPTION OF THE PREFERRED EMBODIMENT

The method of this invention can be applied in a coating system in which an insulating material is deposited on a portion of the target and the rate of ionic bombardment is spatially non-uniform over the surface of the target. One such system is a reactive sputtering process using a planar magnetron device. The system may include a process chamber which can be evacuated and then back-filled with a desired reactant gas.

The figure shows a planar magnetron sputtering device 10 which may be installed in the process chamber. The apparatus 10 includes a target plate 12, a second electrode 11, called an anode, and a grounded dark space shield 13. The target plate 12 may be generally rectangular and the second electrode may be cylindrical bar along one edge of the target plate. This second electrode is called an anode by workers in the art because sputtering systems are usually self-rectifying when an ac potential is applied. The dark space shield is to prevent the formation of a glow disharge adjacent to any but the upper surface of the target plate. Further details of the construction and operation of such a planar magnetron cathode are given in the copending Chapin application referred to above.

When the sputtering apparatus is energized the glow discharge is confined to an annular region just above the surface of the target plate. As the sputtering process continues, an annular erosion region 14 is formed in the target plate. The erosion region does not have sharp boundaries, but the outer and inner edges of the annular region are indicated generally by the lines 16 and 17, respectively. The erosion region is concave and has a line of maximum depth represented by the line 15. The line of maximum erosion is located in alignment with the most intense region of the magnetically confined glow discharge.

In accordance with the invention, an alternating potential is applied between the anode 11 and target 12. This potential may be supplied by a suitable conventional power supply 20. The use of an ac potential substantially eliminates the occurance of arcs which may occur at a rate greater than one per second when a dc potential is used. It is believed that the great reduction in the rate of arc formation can be explained as follows.

Throughout the erosion region 14, the rate of ion bombardment is high. As a result the sputtering rate is much greater than the rate at which an insulating layer would form on the target. Because there is no build-up of an insulating layer, there is no arcing in this region.

Some distance away from the erosion region, the rate of ion bombardment is much lower. In areas of the target plates near the outer periphery 18 and in the central region 19 which is inside the annular erosion region, insulating layers build up continuously. At first, a layer is probably formed by reaction between the gas and the surface atoms of the target plate. Later the layer continues to increase in thickness because of the deposition of insulating material on the target plate.

It is believed that the arcing occurs in regions where the insulating layer exists. In these areas, the ion bombardment is not so great as to prevent the formation of an insulating layer, and the bombardment is sufficient to charge the exposed surface of any layer which forms. This creates an electrostatic field between the surface of the target plate and the exposed surface of the insulating layer. When this field exceeds the dielectric breakdown strength of the insulating layer, an arc results. The arc is believed to occur between the positive column of the glow discharge and the point of the target where the dielectric layer breaks down. The arc leads to a massive increase in current which may damage the power supply.

In accordance with the invention, an alternating potential is established between the two electrodes of the sputtering system. During one part of the cycle, the potential of the target plate is negative, with respect to the glow discharge plasma. Thus, the proper polarity exists to cause ionization and sputtering from the target plate. The exposed surface of the insulating layer is positively charged by ion bombardment. During the other part of the cycle, the polarity is reversed so that the exposed surface of the insulating layer is discharged, probably by electron bombardment. The insulating layer on the cathode surface is repeatedly discharged before the local electric field exceeds that of dielectric breakdown. Thus the cause of the arcing is effectively eliminated.

It is not necessary that the applied potential be sinusoidal or have a symmetrical waveform. For arc reduction, it is only necessary that the polarity reversal allows the surface of the insulating layer to be adequately discharged before the potential difference which would cause an arc is reached.

The lower frequency limit is the lowest frequency which will successfully operate in connection with typical layer thicknesses. The frequency must be high enough to discharge the arc producing potential before it exceeds the breakdown potential. Generally, the thicker the layer, the higher the frequency that is required for a material having a given dielectric constant. For the same layer thickness, those materials which have higher dielectric constants allow use of a lower frequency. For many materials the dielectric constant is in the neighborhood of 7. The thickness of layers which produce arcs are on the order of a few micrometers, for example, 2 $\mu$m and up. Based upon a normal operating impedance of about 100 ohms and using an Airco Temescal magnetron type planar cathode, a typical minimum operating level may be determined to be about 2,700 Hz. However, materials exist which have constants as high as 40. With this dielectric constant and the stated thickness and impedance, the calculated minimum operating frequency is 470 Hz.

The operating frequency should not greatly exceed low radio frequency in order to avoid problems of shielding and of increasing complexity in the power supply. At higher frequencies, capacitive coupling between power conductors and out-of-phase reflections from terminals require the use of reactive impedance matching techniques, such as tuned circuits, in order to maintain efficient power transfer from the supply to the load. The use of such techniques results in a significant increase in cost which tends to offset the advantages gained by avoiding arcing. As a practical matter, the upper frequency limit is about 60,000 Hz. For most materials, it is unnecessary to go to higher frequencies because the thickness of the insulating layer can be kept sufficiently thin.

Materials which may be reactively sputtered in accordance with the present invention include titanium, aluminum, tin, vanadium, tantalum, niobium, indium and zirconium. Metal alloys may also be sputtered in a reactive sputtering system. Reactant gases which may be used include oxygen and nitrogen.

By way of example, the following Table is set out illustrating the method of the invention used in connection with the production of titanium dioxide coatings on glass substrates. It will, however, be apparent that other materials may be sputtered using similar criteria. The data shown in the following Table were obtained by use of a 13 cm (5 in.) diameter water cooled cathode of the planar magnetron type. The magnetic field was provided by an electromagnet in which the current was 7A. The alternating electric potential was 500 V at 10,000 Hz, and the current was approximately 1A. The coatings were made on 2.5 × 7.5 cm (1 × 3 in.) glass slides which were positioned above the cathode. The coatings were estimated to be 0.5 μm thick by an optical interference method.

TABLE

| Example | Partial Pressure O$_2$ (millitorr) | Coating Time (min.) |
|---|---|---|
| 1 | 10 | 5 |
| 2 | 15 | 5 |
| 3 | 15 | 20 |

It may therefore be seen that the invention provides a method for effectively reactive sputtering various materials using a low impedance sputtering system, i.e., a system having less than a few hundred ohms impedance. Coatings of titanium dioxide have been deposited in accordance with the invention at relatively high rates. No arcing was experienced on the cathode surface.

Various modifications of the invention in addition to those shown and described herein will become apparent to those skilled in the art from the foregoing description. Such modifications are intended to fall within the scope of the appended claims.

What is claimed is:

1. In a method for coating a substrate in a process in which an insulating layer is formed on one portion of a conductive target, and a second portion of the target is kept free of the insulating layer by ionic bombardment, the improvement comprising:
    applying an alternating electric potential to the target of a frequency greater than 400 Hz and sufficiently high to substantially eliminate the formation of arcs but less than 60,000 Hz.
2. The method of claim 1 further comprising:
    establishing a glow discharge plasma for creating the ions which bombard the target, and
    confining the glow discharge plasma to an annular region adjacent to the target by use of a magnetron cathode device.
3. The method of claim 2 further comprising:
    establishing a predetermined partial pressure of a reactant gas between the target and the substrate for providing one constituent of the insulating layer.
4. The method of claim 3 wherein the target comprises a reactive metal for providing a second constituent of the insulating layer.
5. The method of claim 4 wherein the reactive metal consists of titanium, aluminum, tin, vanadium, tantalum, niobium, indium or zirconium.
6. The method of claim 4 wherein the reactive gas is oxygen.
7. The method of claim 4 wherein the reactive gas is nitrogen.
8. A method of coating a substrate in a reactive sputtering system having an anode and a planar magnetron cathode which has a conductive target plate, comprising:
    establishing, between the target plate and the substrate, a predetermined partial pressure of a reactant gas which forms an insulating compound with the material of the target plate; and
    establishing an electric potential between the anode and the target plate which alternates at a frequency greater than 400 Hz and sufficiently high to substantially eliminate the formation of arcs but less than 60,000 Hz, which potential is sufficient to sputter material from the target plate for reacting with the reactant gas and forming a coating on the substrate.

* * * * *